US010413946B2

(12) United States Patent
Kim et al.

(10) Patent No.: US 10,413,946 B2
(45) Date of Patent: Sep. 17, 2019

(54) FURNACE-TYPE SEMICONDUCTOR APPARATUS, METHOD OF CLEANING THE SAME, AND METHOD OF FORMING THIN FILM USING THE SAME

(71) Applicant: Samsung Electronics Co., Ltd., Suwon-si (KR)

(72) Inventors: Hyouncheol Kim, Hwaseong-si (KR); Youngil Kwon, Suwon-si (KR); Giduck Kweon, Hwaseong-si (KR); Jong-il Park, Hwaseong-si (KR); Inwoo Seo, Suwon-si (KR); Wooksung Son, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 543 days.

(21) Appl. No.: 15/165,664

(22) Filed: May 26, 2016

(65) Prior Publication Data
US 2017/0008042 A1   Jan. 12, 2017

(30) Foreign Application Priority Data

Jul. 9, 2015 (KR) .................... 10-2015-0097798

(51) Int. Cl.
*B08B 7/00* (2006.01)
*B08B 9/00* (2006.01)
*C23C 16/44* (2006.01)

(52) U.S. Cl.
CPC .............. *B08B 7/0071* (2013.01); *B08B 9/00* (2013.01); *C23C 16/4401* (2013.01)

(58) Field of Classification Search
CPC ..... B08B 7/0071; B08B 9/00; C23C 16/4401; H01L 21/02164; H01L 21/02271

USPC ........................................... 134/19
See application file for complete search history.

(56) References Cited

U.S. PATENT DOCUMENTS

| 5,551,984 A * | 9/1996 | Tanahashi ........... C23C 16/4401 |
| | | 118/715 |
| 6,623,798 B2 | 9/2003 | Shin et al. |
| 6,903,025 B2 | 6/2005 | Mizushima |
| 7,247,561 B2 | 7/2007 | Sarigiannis et al. |
| 7,604,010 B2 | 10/2009 | Hasebe et al. |
| 8,481,434 B2 | 7/2013 | Miya et al. |

(Continued)

FOREIGN PATENT DOCUMENTS

| JP | 2003-077839 | 3/2003 |
| JP | 2005-294512 | 10/2005 |

(Continued)

*Primary Examiner* — Michael E Barr
*Assistant Examiner* — Tinsae B Ayalew
(74) *Attorney, Agent, or Firm* — Myers Bigel, P.A.

(57) ABSTRACT

Embodiments of the inventive concepts provide a method of cleaning a furnace-type semiconductor apparatus that is equipped in a clean room and includes a process chamber in which a process of forming a thin film is performed on a substrate. The method includes supplying air of the clean room into the process chamber after the process of forming the thin film, and thermally treating an inside of the process chamber using the air of the clean room supplied to the inside of the process chamber. An adhered material containing chlorine is formed on an inner surface of the process chamber by the process of forming the thin film, and the chlorine of the adhered material is removed by the thermal treatment of the inside of the process chamber.

19 Claims, 8 Drawing Sheets

(56) References Cited

U.S. PATENT DOCUMENTS

| | | | |
|---|---|---|---|
| 2002/0014205 A1* | 2/2002 | Shin | C23C 16/42 |
| | | | 118/715 |
| 2003/0037802 A1 | 2/2003 | Nakahara et al. | |
| 2006/0141782 A1* | 6/2006 | Hasebe | C23C 16/4408 |
| | | | 438/680 |
| 2012/0304930 A1 | 12/2012 | Verdict et al. | |
| 2014/0295675 A1* | 10/2014 | Ikeuchi | H01L 21/67109 |
| | | | 438/773 |

FOREIGN PATENT DOCUMENTS

| | | |
|---|---|---|
| JP | 3957995 | 5/2007 |
| JP | 2008-283148 | 11/2008 |
| JP | 5571233 | 7/2014 |
| KR | 10-0364656 | 12/2002 |
| KR | 10-2007-0013099 | 1/2007 |
| KR | 10-0690459 | 2/2007 |
| KR | 10-1422651 | 7/2014 |

* cited by examiner

FURNACE-TYPE SEMICONDUCTOR APPARATUS, METHOD OF CLEANING THE SAME, AND METHOD OF FORMING THIN FILM USING THE SAME

CROSS-REFERENCE TO RELATED APPLICATION

This U.S. non-provisional patent application claims priority under 35 U.S.C. § 119 to Korean Patent Application No. 10-2015-0097798, filed on Jul. 9, 2015, the disclosure of which is hereby incorporated by reference in its entirety.

BACKGROUND

Embodiments of the inventive concepts relate to an apparatus for forming a thin film, a method of cleaning the same, and a method of forming a thin film using the same. More particularly, embodiments of the inventive concepts relate to a furnace-type semiconductor apparatus, a method of cleaning the same, and method of forming a thin film using the same.

Semiconductor manufacturing techniques have been developed to improve integration densities, reliability and response speeds of semiconductor devices. Generally, semiconductor processes (e.g., a deposition process, a diffusion process, a photolithography process, and/or an etching process) may be performed on a silicon wafer to form patterns having electrical characteristics, so semiconductor devices including the patterns may be realized.

In manufacturing processes of semiconductor devices, a low-pressure chemical vapor deposition (LP-CVD) process and a thermal treatment process may be performed in a vertical furnace. For example, a furnace-type semiconductor apparatus may include a heating member, and a process tube formed of quartz in the heating member. In addition, a boat for receiving a plurality of wafers may be located in the process tube. The plurality of wafers loaded in the boat may be provided into a process space (i.e., a process chamber) at once, and the deposition or thermal treatment process may be performed on the plurality of wafers at the same time.

When the deposition process is performed using the furnace-type semiconductor apparatus, reaction products and/or reaction by-products may be formed in a film shape on an inner surface of the furnace-type semiconductor apparatus to act as a source of particles. These particles may cause reduction of a yield of semiconductor devices and reduction of efficiency of the apparatus.

SUMMARY

Embodiments of the inventive concepts may provide a furnace-type semiconductor apparatus capable of effectively removing a particle therein and a method of cleaning the same.

Embodiments of the inventive concepts may also provide a method of forming a thin film, which is capable of reducing or minimizing particles.

Some embodiments of the inventive concepts provide a method of cleaning a furnace-type semiconductor apparatus that is equipped in a clean room and includes a process chamber in which a process of forming a thin film is performed on a substrate. The method may include supplying air of the clean room into the process chamber after the process of forming the thin film, and thermally treating an inside of the process chamber using the air of the clean room supplied to the inside of the process chamber. An adhered material containing chlorine may be formed on an inner surface of the process chamber by the process of forming the thin film, and the chlorine of the adhered material may be removed by the thermal treatment of the inside of the process chamber.

In an embodiment, the air of the clean room may include moisture ($H_2O$), and the chlorine may be converted into vaporized hydrogen chloride by reaction with the moisture so as to be separated from the adhered material.

In an embodiment, the method may further include exhausting the vaporized hydrogen chloride outside the process chamber.

In an embodiment, the supplying of the air of the clean room may be carried out using a first cleaning gas supply pipe connected to the process chamber. One end of the first cleaning gas supply pipe may be connected to the process chamber and another end of the first cleaning gas supply pipe may be located in the clean room.

In an embodiment, the using of the first cleaning gas supply pipe may include drawing in the air of the clean room by an air-intake device on the first cleaning gas supply pipe.

In an embodiment, the method may further include supplying a gas containing hydrogen and oxygen into the process chamber using a second cleaning gas supply unit connected to the process chamber.

In an embodiment, the gas containing hydrogen and oxygen may be supplied into the process chamber to form water vapor, and the chlorine may be converted into vaporized hydrogen chloride by reaction with the water vapor so as to be separated from the adhered material.

In an embodiment, the second cleaning gas supply unit may include a cleaning gas tank storing the gas containing hydrogen and oxygen, and a second cleaning gas supply pipe connecting the cleaning gas tank to the process chamber.

In an embodiment, the method may further include supplying air containing moisture into the process chamber using a second cleaning gas supply unit connected to the process chamber.

In an embodiment, the thermal treatment of the inside of the process chamber may be performed at a temperature of 500 degrees Celsius to 800 degrees Celsius and a pressure of 3 Torr to 10 Torr.

In an embodiment, the furnace-type semiconductor apparatus may further include a load-lock chamber disposed under the process chamber and configured to purge an inside of the load-lock chamber by drawing in the air of the clean room, and a boat holding the substrate during the process of forming the thin film and configured to be moved vertically between the process chamber and the load-lock chamber. The supplying of the air of the clean room may include purging the inside of the load-lock chamber by drawing in the air of the clean room, and vertically moving the boat between the process chamber and the load-lock chamber during the purging of the inside of the load-lock chamber to provide the air of the clean room drawn in the load-lock chamber into the process chamber.

In an embodiment, the furnace-type semiconductor apparatus may further include an opening and closing member disposed between the process chamber and the load-lock chamber. The opening and closing member may be configured to open and close a path through which the boat is moved vertically, and the opening and closing member may open the path during the purging of the inside of the load-lock chamber.

In an embodiment, the thermal treatment of the inside of the process chamber maybe performed at a temperature of 500 degrees Celsius to 600 degrees Celsius under normal atmospheric pressure.

In an embodiment, the adhered material may include silicon oxide containing chlorine.

In an embodiment, the process of forming the thin film may be performed using a silicon precursor containing chlorine and a gas containing oxygen.

In an embodiment, the silicon precursor containing chlorine may include di-chlorosilane (DCS) or hexa-chlorodisilane (HCD).

In an embodiment, a flow rate of the air of the clean room supplied into the process chamber may range from 5 liters/minute to 20 liters/minute.

Some embodiments of the inventive concepts provide a furnace-type semiconductor apparatus equipped in a clean room. The furnace-type semiconductor apparatus may include a process chamber providing a space in which a process is performed, a boat configured to support a substrate and located in the process chamber when the process is performed, a load-lock chamber disposed under the process chamber and providing a space in which the substrate is loaded into the boat, a process gas supply unit configured to supply a process gas into the process chamber, and a first cleaning gas supply unit configured to supply air of the clean room into the process chamber. The process chamber may be heated to a process temperature by a heating member when the process is performed.

In an embodiment, the first cleaning gas supply unit may include a first cleaning gas supply pipe connecting an inside of the process chamber to an inside of the clean room. One end of the first cleaning gas supply pipe may be connected to the process chamber and another end of the first cleaning gas supply pipe may be located in the clean room.

In an embodiment, the first cleaning gas supply unit may further include an air-intake device on the first cleaning gas supply pipe configured to draw in the air of the clean room, and a first cleaning gas valve on the first cleaning gas supply pipe configured to adjust a flow rate of the inhaled air. The air-intake device may be disposed in the clean room.

In an embodiment, the furnace-type semiconductor apparatus may further include a second cleaning gas supply unit supplying a gas containing hydrogen and oxygen or air containing moisture into the process chamber.

In an embodiment, the second cleaning gas supply unit may include a cleaning gas tank storing the gas containing hydrogen and oxygen or the air containing moisture, a second cleaning gas supply pipe connecting the cleaning gas tank to the process chamber, and a second cleaning gas valve on the second cleaning gas supply pipe.

In an embodiment, the furnace-type semiconductor apparatus may further include a purge gas supply unit connected to the process chamber and configured to supply a purge gas into the process chamber.

In an embodiment, the furnace-type semiconductor apparatus may further include an opening and closing member disposed between the process chamber and the load-lock chamber to open and close a path through which the boat is moved.

In an embodiment, the furnace-type semiconductor apparatus may further include a housing surrounding the process chamber and the load-lock chamber. An air circulation path may be defined in the housing such that the air of the clean room circulates in the housing through the air circulation path.

In an embodiment, the load-lock chamber may include a fan configured to draw in the air of the clean room such that the air circulates in the housing, and a filter at the fan configured to filter the air of the clean room that passes through the fan.

Some embodiments of the inventive concepts provide a method of forming a thin film. The method may include forming the thin film on a substrate using the furnace-type semiconductor apparatus described above.

In an embodiment, the forming of the thin film on the substrate may be performed using a silicon precursor containing chlorine and a gas containing oxygen as a process gas.

Some embodiments of the inventive concepts provide a method of cleaning a furnace-type semiconductor apparatus that is equipped in a clean room and includes a process chamber in which a process of forming a thin film is performed on a substrate. The method includes: supplying air from the clean room into the process chamber after the process of forming the thin film; and using the air supplied from the clean room, removing chlorine from an adhered material formed on an inner surface of the process chamber due to the process of forming the thin film.

In an embodiment, the supplying of the air of the clean room is carried out using a first cleaning gas supply pipe including a first end connected to the process chamber and a second, opposite end that is in the clean room.

In an embodiment, the furnace-type semiconductor apparatus further includes: a load-lock chamber disposed under the process chamber, with the load-lock chamber configured to purge an inside of the load-lock chamber by drawing in the air of the clean room; and a boat configured to hold the substrate and configured to move vertically between the process chamber and the load-lock chamber. The supplying of the air of the clean room may include: purging the inside of the load-lock chamber by drawing in the air of the clean room; and vertically moving the boat between the process chamber and the load-lock chamber during the purging of the inside of the load-lock chamber to provide the air of the clean room drawn in the load-lock chamber into the process chamber.

Some embodiments of the inventive concepts provide a method of cleaning a furnace-type semiconductor apparatus that is equipped in a clean room and includes a process chamber in which a process of forming a thin film is performed on a substrate. The method includes: supplying air of the clean room including moisture ($H_2O$) into the process chamber after the process of forming the thin film; converting chlorine of an adhered material formed on an inner surface of the process chamber due to the process of forming the thin film into vaporized hydrogen chloride by reaction with the moisture to separate the chlorine from the adhered material; and exhausting the vaporized hydrogen chloride outside the process chamber.

BRIEF DESCRIPTION OF THE DRAWINGS

The inventive concepts will become more apparent in view of the attached drawings and accompanying detailed description.

DETAILED DESCRIPTION OF THE EMBODIMENTS

Figure 1:
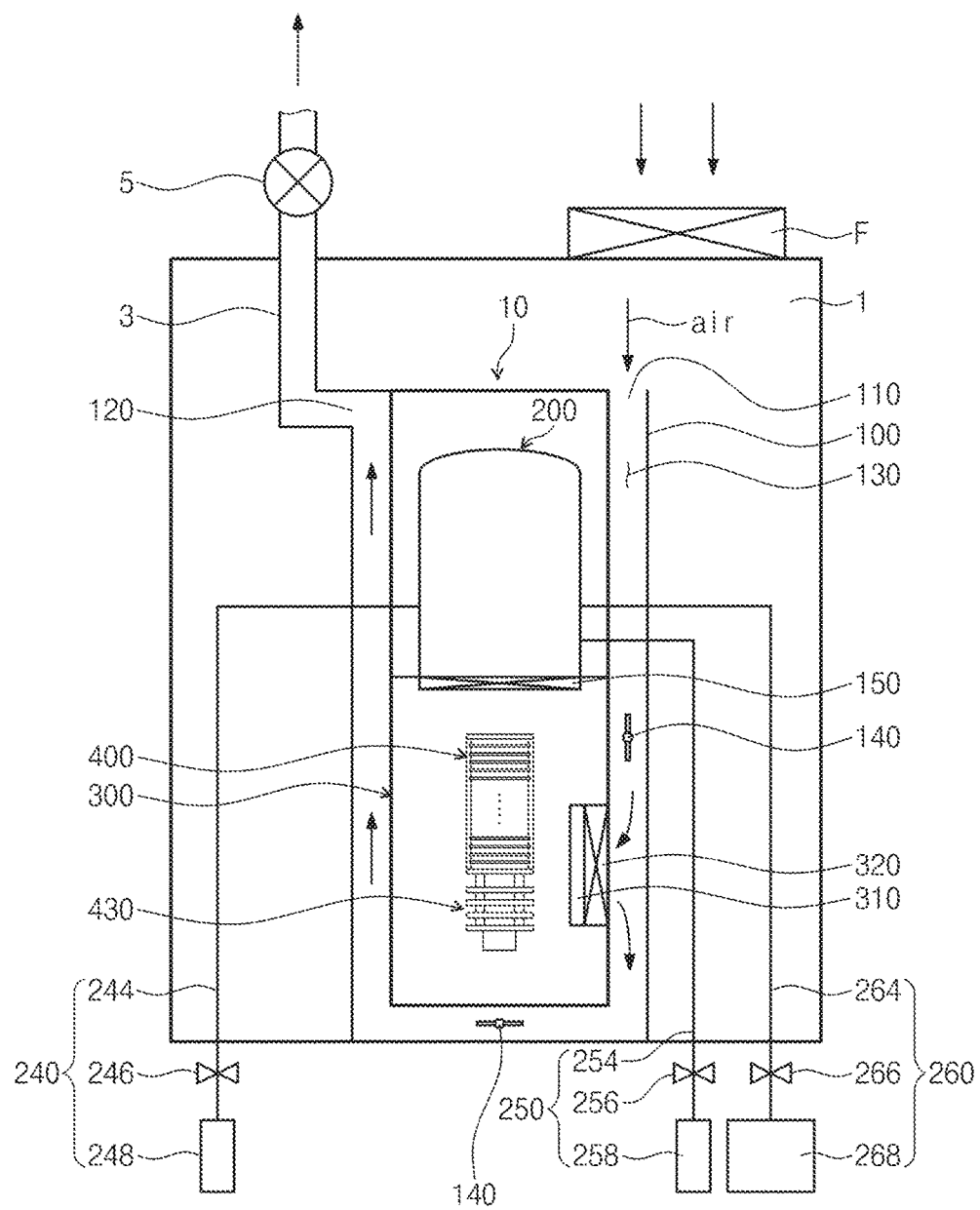
FIG. 1 is a schematic side view illustrating semiconductor manufacturing equipment including a furnace-type semiconductor apparatus according to an embodiment of the inventive concepts.

The advantages and features of the inventive concepts and methods of achieving them will be apparent from the following example embodiments that will be described in more detail with reference to the accompanying drawings. It should be noted, however, that the inventive concepts are not limited to the following example embodiments, and may be implemented in various forms. Accordingly, the example embodiments are provided only to disclose the inventive concepts and let those skilled in the art know the category of the inventive concepts. In the drawings, embodiments of the inventive concepts are not limited to the specific examples provided herein and elements or features in the drawings may be exaggerated for clarity.

It will be understood that when an element such as a layer, region or substrate is referred to as being "on" another element, it can be directly on the other element or intervening elements may be present. In contrast, the term "directly on" means that there are no intervening elements. Similarly, it will be understood that when an element is referred to as being "coupled" or "connected" to another element, it can be directly coupled or connected to the other element or intervening elements may also be present. In contrast, when an element is referred to as being "directly coupled" or "directly connected" to another element, there are no intervening elements present. The same reference numerals or the same reference designators denote the same elements throughout the specification.

Example embodiments are described herein with reference to cross-sectional illustrations and/or plan illustrations that are idealized example illustrations. Accordingly, variations from the shapes of the illustrations as a result, for example, of manufacturing techniques and/or tolerances, are to be expected. Thus, example embodiments should not be construed as limited to the shapes of elements, features or regions illustrated herein but are to include deviations in shapes that result, for example, from manufacturing. It will be also understood that although the terms first, second, third, etc. may be used herein to describe various elements, these elements should not be limited by these terms. These terms are only used to distinguish one element from another element. Thus, a first element in some embodiments could be termed a second element in other embodiments without departing from the teachings of the present inventive concepts. Example embodiments of aspects of the present inventive concepts explained and illustrated herein include their complementary counterparts.

The terminology used herein is for the purpose of describing particular embodiments only and is not intended to limit the inventive concepts. As used herein, the singular terms "a," "an" and "the" are intended to include the plural forms as well, unless the context clearly indicates otherwise. As used herein, the term "and/or" includes any and all combinations of one or more of the associated listed items. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

The inventive concepts will now be described more fully hereinafter with reference to the accompanying drawings.

Figure 2:
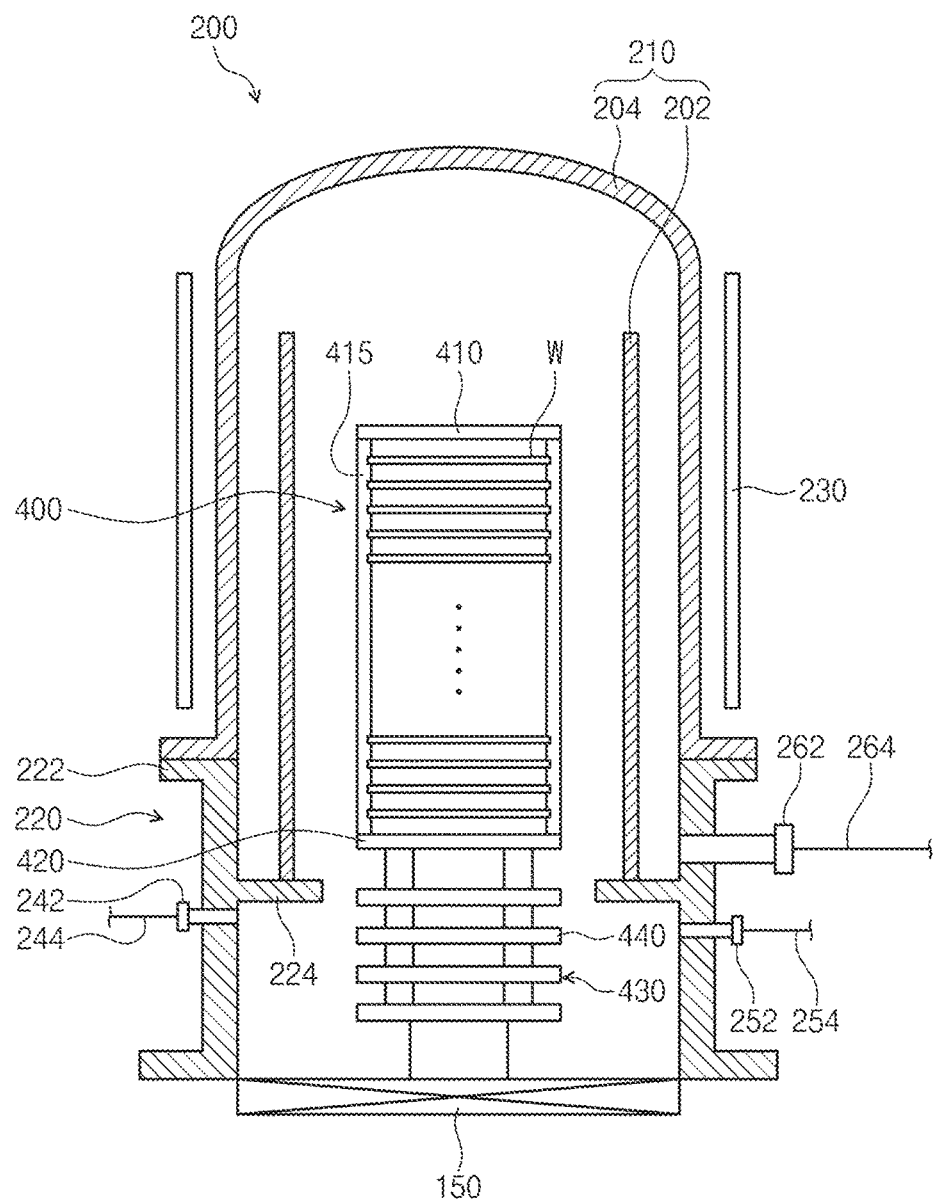
FIG. 2 is a cross-sectional view illustrating a process chamber of the furnace-type semiconductor apparatus of FIG. 1.
Figure 3:
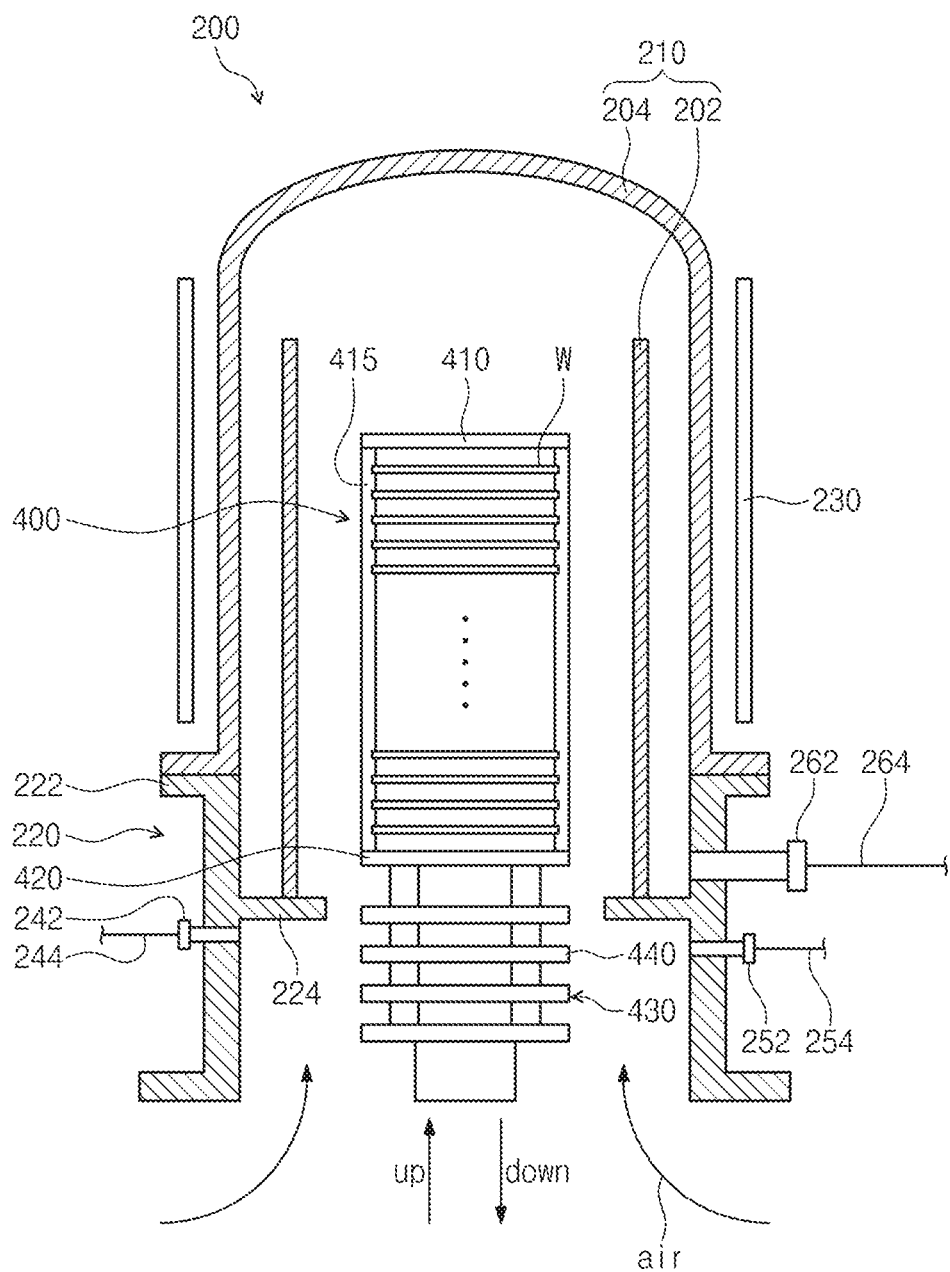
FIG. 3 is a cross-sectional view illustrating a state in which air flows from a load-lock chamber into a process chamber by vertical movement of a boat.

FIG. 1 is a schematic side view illustrating semiconductor manufacturing equipment including a furnace-type semiconductor apparatus 10 according to an embodiment of the inventive concepts. FIG. 2 is a cross-sectional view illustrating a process chamber 200 of the furnace-type semiconductor apparatus 10 of FIG. 1. FIG. 3 is a cross-sectional view illustrating a state in which air flows from a load-lock chamber 300 into the process chamber 200 by vertical movement of a boat 400.

Referring to FIGS. 1 and 2, semiconductor manufacturing equipment may include a clean room 1 and a semiconductor process apparatus equipped in the clean room 1. In embodiments of the inventive concepts, the furnace-type semiconductor apparatus 10 may be used as the semiconductor process apparatus. The furnace-type semiconductor apparatus 10 may perform a low-pressure chemical vapor deposition (LP-CVD) process and/or a thermal treatment process on a substrate (e.g., a wafer W). In an embodiment, the furnace-type semiconductor apparatus 10 may be used to form a gate dielectric layer of a metal-oxide-semiconductor (MOS) transistor included in a semiconductor device. In an embodiment, the furnace-type semiconductor apparatus 10 may be used to perform a thermal treatment process for diffusing impurities into a gate electrode of the MOS transistor. However, embodiments of the inventive concepts are not limited thereto. The furnace-type semiconductor apparatus 10 may be used for various other semiconductor processes for forming and/or thermally treating a thin film.

The clean room 1 may provide a clean space in which clean air circulates to prevent contamination of a surface of the wafer W. For example, an air filter F may be installed at a ceiling of the clean room 1, and thus air filtered in the air filter F may be provided around the furnace-type semiconductor apparatus 10. Air may be provided into the air filter F by a ventilator installed on the air filter F. The air of the clean room 1 may be induced into a return path provided at a floor or a sidewall of the clean room 1 to adjust temperature and humidity of the clean room 1. In an embodiment, the temperature of the clean room 1 may be maintained in a range of 22 degrees Celsius to 25 degrees Celsius, and the humidity of the clean room 1 may be maintained in a range of 45% to 55%. Thus, the air in the clean room 1 may include moisture. Thereafter, the air may be returned into a plenum chamber and may then be provided into the clean room 1 through the air filter F. Dust of the air provided from the plenum chamber may be removed by the air filter F.

The furnace-type semiconductor apparatus 10 equipped in the clean room 1 may perform the semiconductor process in a stable space where surrounding environment and contamination are minimized. The furnace-type semiconductor apparatus 10 according to an embodiment may include a housing 100, the process chamber 200, the load-lock chamber 300, and the boat 400.

The housing 100 may be formed of one or more panels (e.g., a steel panel) to surround the process chamber 200 and the load-lock chamber 300. In other words, the housing 100 may include an upper space or upper portion and a lower space or lower portion therein. The process chamber 200 is provided in the upper space of the housing 100, and the load-lock chamber 300 is provided in the lower space of the housing 100. The upper space and the lower space of the housing 100 may be respective spaces that are not connected to each other. However, embodiments of the inventive concepts are not limited thereto. An air inlet 110 may be provided at a top surface of the housing 100, and the air of the clean room 1 may flow through the air inlet 110 into an air circulation path 130 of the housing 100. The air circulation path 130 may be provided in the housing 100. Dampers 140 for controlling a flow of air may be installed in the air circulation path 130. The air provided into the air circulation path 130 may be exhausted to the outside of the housing 100 through an exhaust duct 3. The exhaust duct 3 may be connected to an air outlet 120 formed at an upper portion of a sidewall of the housing 100. The exhaust duct 3 may extend to penetrate the ceiling of the clean room 1 and may be connected to an exhaust path located in a fabrication facility (FAB). An exhaust fan 5 corresponding to an exhaust member may be installed at or in the exhaust duct 3.

The process chamber 200 may provide a space in which the semiconductor process (e.g., the LP-CVD process) is performed on wafers W. The boat 400 may support the wafers W during the semiconductor process. The load-lock chamber 300 may be disposed under the process chamber 200. In a state where the boat 400 is located in the load-lock chamber 300, the wafers W may be loaded into and/or unloaded from the boat 400 by a transfer robot. The transfer robot may be located outside the load-lock chamber 300, and an opening through which an arm of the transfer robot moves may be formed in one sidewall of the load-lock chamber 300 (e.g., to penetrate one sidewall of the load-lock chamber 300). The opening may be opened and closed by a door. The boat 400 may be moved vertically between the process chamber 200 and the load-lock chamber 300 by an elevating member. A member 150 such as a door, gate or wall for opening and closing a path through which the boat 400 is moved may be installed between the load-lock chamber 300 and the process chamber 200. After the loading of the wafers W into the boat 400 is completed, the boat 400 may be moved from the load-lock chamber 300 into the process chamber 200.

A fan 310 may be provided in the load-lock chamber 300. The fan 310 may be used to perform a purge operation of the load-lock chamber 300. In other words, the fan 310 may circulate the air in the load-lock chamber 300. In detail, the air provided into the air circulation path 130 may flow into the load-lock chamber 300 by the fan 310. Thereafter, the air provided in the load-lock chamber 300 may be exhausted to the air circulation path 130 and may then be exhausted to the outside of the housing 100 by the exhaust fan 5 installed at the exhaust duct 3. A filter 320 may be provided at the fan 310 (e.g., in front of the fan 310) to filter the air flowing into the load-lock chamber 300. On the other hand, as illustrated in FIG. 3, if the vertical movement of the boat 400 between the chambers 300 and 200 through the path opened by the member 150 is repeated during the purge operation, the air provided in the load-lock chamber 300 may flow into the process chamber 200. The air provided in the process chamber 200 by this manner may be used to clean the furnace-type semiconductor apparatus 10. This will be described in more detail below.

The boat 400 may include a top plate 410, a bottom plate 420, and side or vertical supporters 415. The top and bottom plates 410 and 420 may have circular plate shapes and may be vertically spaced apart from each other to face each other. A plurality of the vertical supporters 415 may be disposed between the top plate 410 and the bottom plate 420 and may be coupled to the top and bottom plates 410 and 420. In an embodiment, three or four vertical supporters 415 may be provided and each of the vertical supporters 415 may have a rod shape extending in a vertical direction. Slots in which edge portions of the wafers W are laid may be formed in each of the vertical supporters 415. For example, the number of the slots formed in each of the vertical supporters 415 may be in a range of about 25 to about 50, and thus, the number of the wafers W loaded in the boat 400 at once may be in a range of about 25 to about 50. The boat 400 may be supported by a boat supporting member or unit 430, and heat-blocking plates 440 may be horizontally held or inserted in the boat supporting unit 430. The heat-blocking plates 440 may be formed of quartz and may be used to uniformly provide a process gas around the boat 400. In addition, the heat-blocking plates 440 may prevent heat in the process chamber 200 from being transmitted downward so to be lost. A boat driving unit may be coupled to a bottom end of the boat supporting unit 430. The boat driving unit may vertically move the boat 400 and may rotate the boat 400.

The process chamber 200 may include a process tube 210, a flange 220, and a heating member 230. In an embodiment, the process chamber 200 may include an inner tube 202 and an outer tube 204 surrounding the inner tube 202. The inner and outer tubes 202 and 204 may be formed of quartz. The inner tube 202 may be disposed in the outer tube 204 and may be spaced apart from the outer tube 204 by a predetermined distance. The outer tube 204 may have a hollow cylindrical shape having an open bottom end, and the open bottom end of the outer tube 204 may be connected or joined to a top end of the flange 220. The inner tube 202 may have a hollow cylindrical shape of which a top end and a bottom end are open. The inner tube 202 may receive the boat 400 therein. During the semiconductor process, the boat 400 is located in an inner space of the inner tube 202.

The flange 220 may be disposed on a top surface of the load-lock chamber 300. The flange 220 may be hollow, and a bottom end of the flange 220 may be open. The opening and closing member 150 may be installed on the open bottom end of the flange 220. Since the bottom end of the flange 220 is closed by the opening and closing member 150, the flow of air may be blocked to seal the inner space of the process tube 210. The semiconductor process (e.g., the LP-CVD process) may be performed in the sealed space. A support or supporting part 222 (e.g., an upper ledge) may be disposed on the top end of the flange 220, and a support or supporting part 224 (e.g., a lower ledge) having a ring shape may protrude inwardly from an inner sidewall of the flange 220. The supporting part 222 may support the outer tube 204, and the supporting part 224 may support the inner tube 202. A process gas injection port 242 may be provided at one side of the flange 220 and may be connected to a process gas supply pipe 244. The process gas may flow into the inner tube 202 through an injection nozzle so as to be provided to the wafers W loaded in the boat 400. The injection nozzle may have a horizontal portion connected to the process gas injection port 242 and the process gas supply pipe 244, and a vertical portion vertically extending from the horizontal portion into the inner tube 202. The vertical portion may extend to a position adjacent to a wafer W loaded in the topmost or uppermost slot of the boat 400 located in the inner tube 202 or may extend to a position higher than the adjacent position. A plurality injection holes may be formed in the vertical portions along a longitudinal direction thereof. The process gas may be injected to the wafers W through the plurality injection holes. The number of the process gas injection port 242 may be variously changed according to a kind of a film to be deposited on the wafer W. In an embodiment, a plurality of process gas injection ports 242 may be provided. A purge gas injection port 252 may be provided at another side of the flange 220 and may be connected to a purge gas supply pipe 254. The purge gas may remove reaction by-products and a residual gas existing in the process chamber 200. In an embodiment, a nitrogen gas may be used as the purge gas. In the present embodiment, the purge gas injection port 252 may be provided to another side of the flange 220 (e.g., an opposite side of the flange 220 as the process gas injection port 242). However, embodiments of the inventive concepts are not limited thereto. In an embodiment, the purge gas injection port 252 may be provided at the same side of the flange 220. An exhaust port 262 may be provided above the purge gas injection port 252. An exhaust pipe 264 may be connected to the exhaust port 262. The exhaust pipe 264 may be used to form a low-pressure atmosphere during the semiconductor process and may be used to exhaust process by-products (e.g., the reaction by-products and/or the residual gas).

The heating member 230 for heating the inside of the process tube 210 to a process temperature may be installed outside the process tube 210. The heating member 230 may be spaced apart from an outer sidewall of the outer tube 204 and may surround the outer tube 204. In an embodiment, the heating member 230 may include a heating wire surrounding the process tube 210. However, embodiments of the inventive concepts are not limited thereto.

A process gas supply unit 240 may be connected to the one side of the flange 220 so as to be connected to the inside of the process chamber 200. The process gas supply unit 240 may include a process gas tank 248 storing the process gas, the process gas supply pipe 244 connecting the process gas tank 248 to the process gas injection port 242, and a process gas valve 246 installed at or on the process gas supply pipe 244 to adjust a flow rate of the process gas. The process gas tank 248 may be disposed outside the fabrication facility (FAB). The process gas stored in the process gas tank 248 may include a process gas for forming a silicon oxide layer. According to an embodiment, the process gas may include a silicon precursor containing chlorine and an oxygen containing gas. For example, the silicon precursor containing chlorine may include di-chlorosilane (DCS) or hexa-chlorodisilane (HCD). For example, the oxygen containing gas may include oxygen ($O_2$), ozone ($O_3$), or nitrous oxide ($N_2O$).

A purge gas supply unit 250 may be connected to another side of the flange 220 so as to be connected to the inside of the process chamber 200. The purge gas supply unit 250 may include a purge gas tank 258 storing an inert gas, the purge gas supply pipe 254 connecting the purge gas tank 258 to the purge gas injection port 252, and a purge gas valve 256 installed at or on the purge gas supply pipe 254 to adjust a flow rate of the inert gas. For example, the inert gas stored in the purge gas tank 258 may include a nitrogen ($N_2$) gas, an argon (Ar) gas, or a hydrogen ($H_2$) gas.

A vacuum exhaust unit 260 may be connected to another side of the flange 220 so as to be connected to the inside of the process chamber 200. The vacuum exhaust unit 260 may exhaust a non-process gas and/or a by-product gas from the process chamber 200. The vacuum exhaust unit 260 may include a vacuum pump 268 for forming or placing the inside of the process chamber 200 into a desired pressure state, the exhaust pipe 264 connecting the vacuum pump 268 to the exhaust port 262, and a vacuum valve 266 installed at or on the exhaust pipe 264 to adjust the inner pressure of the process chamber 200.

Figure 4:
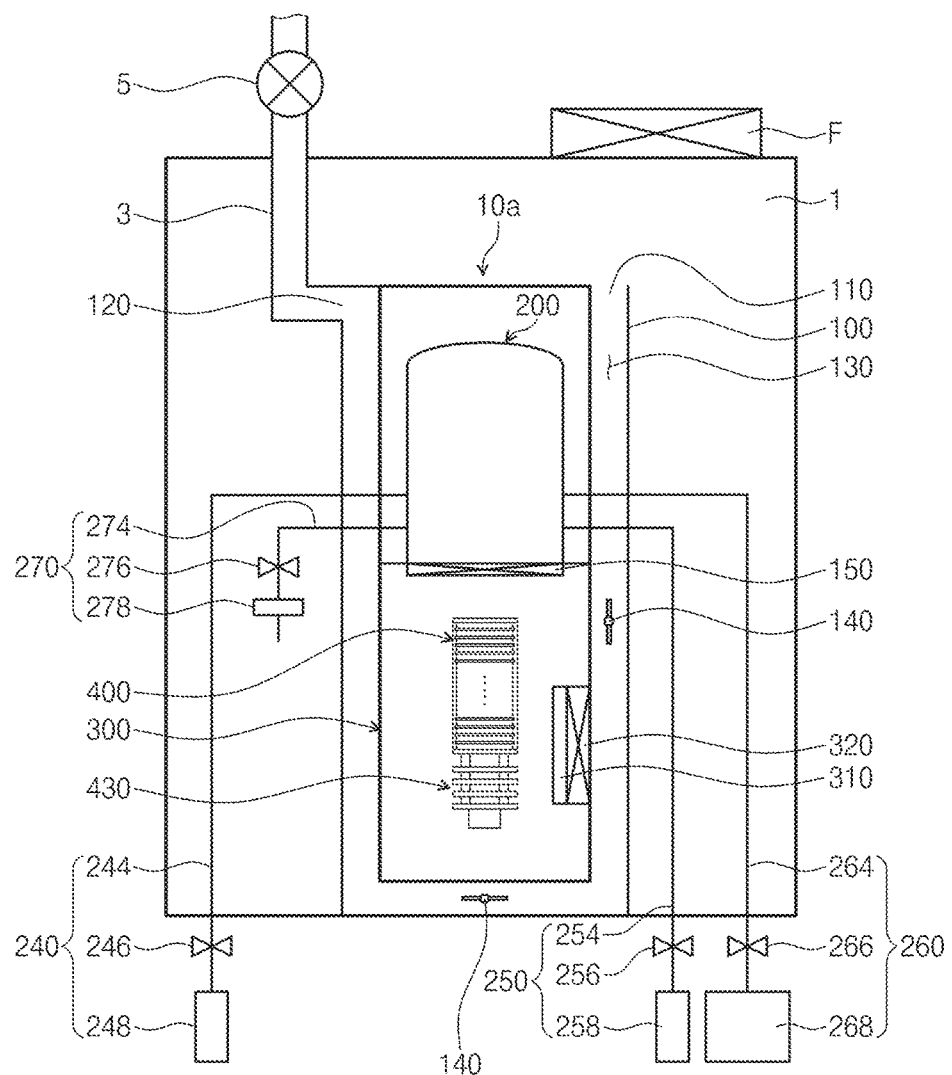
FIG. 4 is a schematic side view illustrating semiconductor manufacturing equipment including a furnace-type semiconductor apparatus according to an embodiment of the inventive concepts.
Figure 5:
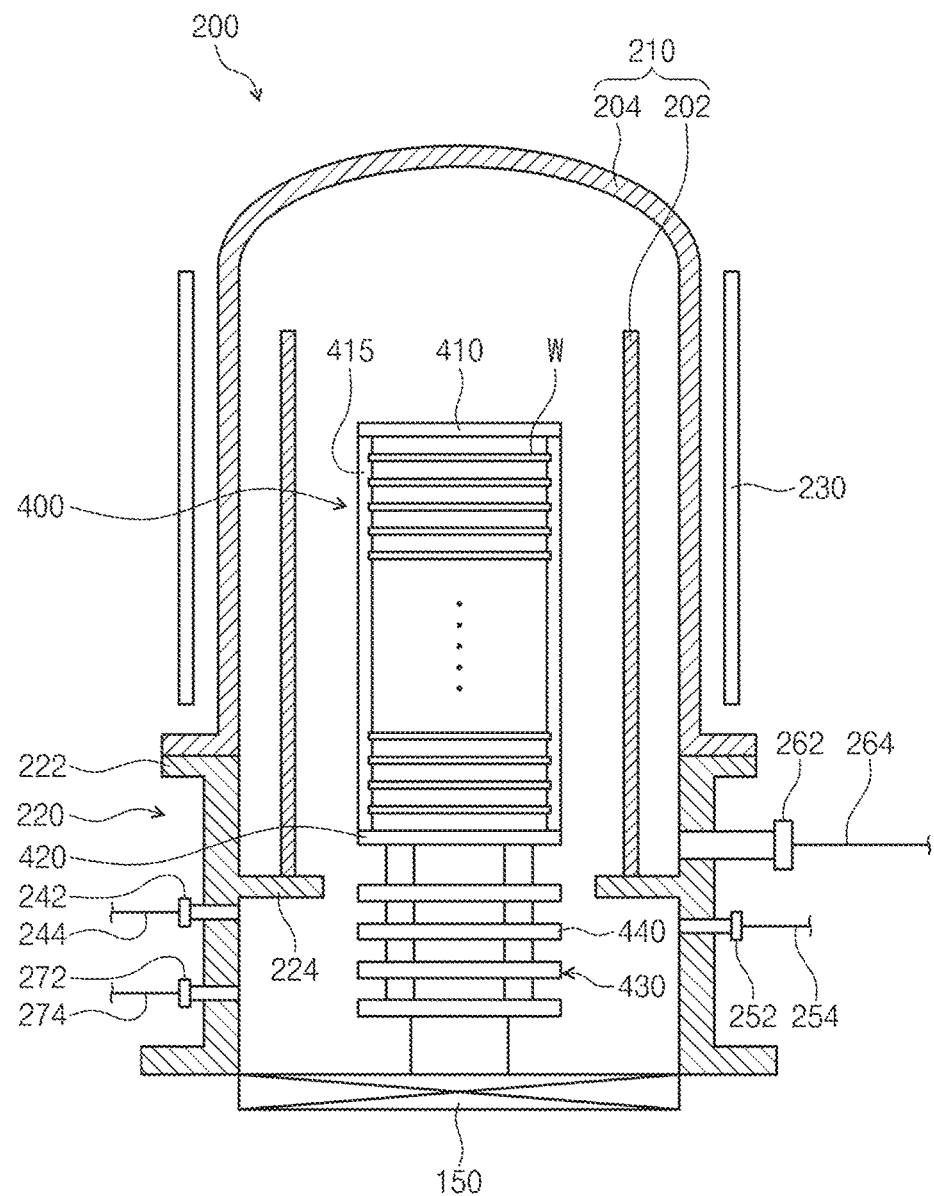
FIG. 5 is a cross-sectional view illustrating a process chamber of the furnace-type semiconductor apparatus of FIG. 4.

FIG. 4 is a schematic side view illustrating semiconductor manufacturing equipment including a furnace-type semiconductor apparatus 10a according to an embodiment of the inventive concepts. FIG. 5 is a cross-sectional view illustrating a process chamber of the furnace-type semiconductor apparatus 10a of FIG. 4. The furnace-type semiconductor apparatus 10a according to the present embodiment may further include a first cleaning gas supply unit 270. Other elements of the furnace-type semiconductor apparatus 10a may be the same or substantially the same as corresponding elements of the furnace-type semiconductor apparatus 10 described with reference to FIGS. 1 and 2. In the present embodiment, the descriptions to the same elements as in the embodiment of FIGS. 1 and 2 may be omitted or mentioned briefly for the purpose of ease and convenience in explanation.

Referring to FIGS. 4 and 5, the first cleaning gas supply unit 270 may be connected to the process chamber 200. The first cleaning gas supply unit 270 may supply the air in the clean room 1 into the process chamber 200. The first cleaning gas supply unit 270 may include a first cleaning gas supply pipe 274 connected to one side of the flange 220, an air-intake device 278 installed at or on the first cleaning gas supply pipe 274 to draw in, inhale or intake the air from the clean room 1, and a first cleaning gas valve 276 adjusting a flow rate of the inhaled air. In detail, one end of the first cleaning gas supply pipe 274 may be connected to a first cleaning gas injection port 272 provided at one side of the flange 220, and another end of the first cleaning gas supply pipe 274 may be located in the clean room 1. In other words, the inside of the process chamber 200 may be connected to the inside of the clean room 1 through the first cleaning gas supply pipe 274. The air-intake device 278 may be, for example, a pump. The air-intake device 278 may be installed in the clean room 1 and may be disposed outside the process chamber 200. The air in the clean room 1 may be supplied into the process chamber 200 through the first cleaning gas supply pipe 274 by driving the air-intake device 278. In other words, the first cleaning gas may be the air in the clean room 1.

Figure 6:
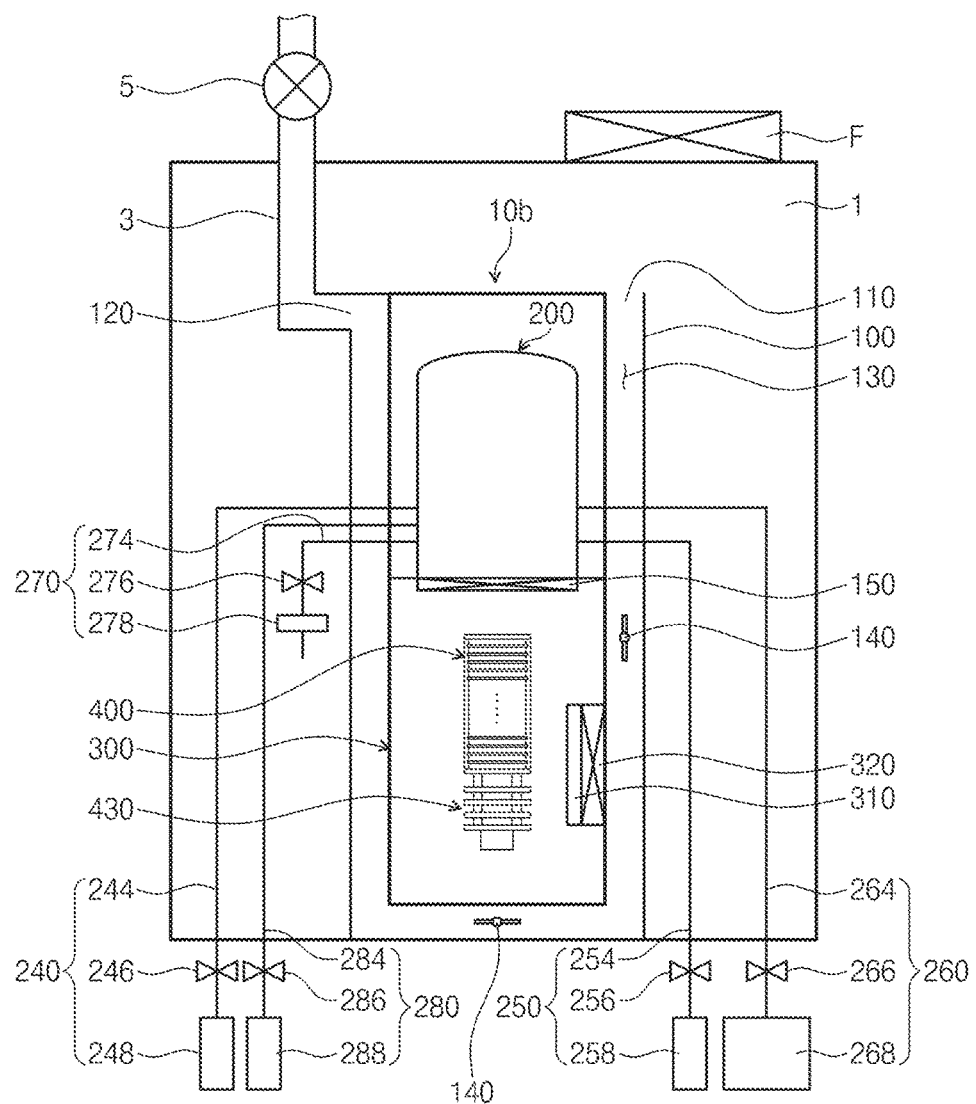
FIG. 6 is a schematic side view illustrating semiconductor manufacturing equipment including a furnace-type semiconductor apparatus according to an embodiment of the inventive concepts.
Figure 7:
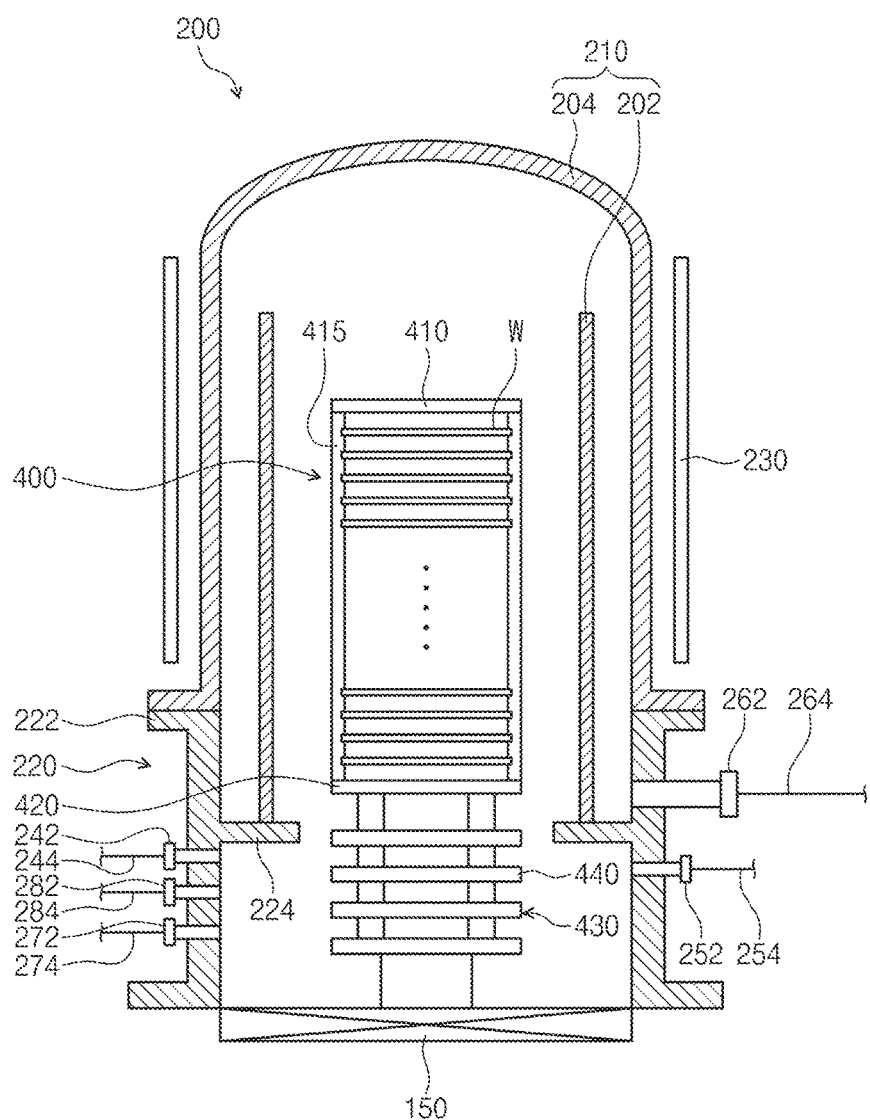
FIG. 7 is a cross-sectional view illustrating a process chamber of the furnace-type semiconductor apparatus of FIG. 6.

FIG. 6 is a schematic side view illustrating semiconductor manufacturing equipment including a furnace-type semiconductor apparatus 10b according to an embodiment of the inventive concepts. FIG. 7 is a cross-sectional view illustrating a process chamber of the furnace-type semiconductor apparatus 10b of FIG. 6. The furnace-type semiconductor apparatus 10b according to the present embodiment may further include a first cleaning gas supply unit 270 and a second cleaning gas supply unit 280. Other elements of the furnace-type semiconductor apparatus 10b may be the same or substantially the same as corresponding elements of the furnace-type semiconductor apparatus 10 described with reference to FIGS. 1 and 2. In the present embodiment, the descriptions to the same elements as in the embodiment of FIGS. 1 and 2 may be omitted or mentioned briefly for the purpose of ease and convenience in explanation.

Referring to FIGS. 6 and 7, the first cleaning gas supply unit 270 and the second cleaning gas supply unit 280 may be connected to the process chamber 200. The first cleaning gas supply unit 270 may be the same or substantially the same as described with reference to FIGS. 4 and 5. The second cleaning gas supply unit 280 may be connected to one side of the flange 220 so as to be connected to the process chamber 200. The second cleaning gas supply unit 280 may include a second cleaning gas tank 288 storing a second cleaning gas, a second cleaning gas supply pipe 284 connecting the second cleaning gas tank 288 to a second cleaning gas injection port 282, and a second cleaning gas valve 286 installed at or on the second cleaning gas supply pipe 284 to adjust a flow rate of the second cleaning gas. The second cleaning gas tank 288 may be disposed outside the fabrication facility (e.g., outside the clean room 1). In an embodiment, the second cleaning gas stored in the second cleaning gas tank 288 may include an oxygen containing gas and a hydrogen containing gas. In this case, a plurality of second cleaning gas tanks 288 may be provided, unlike FIG. 6. In an embodiment, the second cleaning gas stored in the second cleaning gas tank 288 may include air containing moisture. In the present embodiment, the second cleaning gas injection port 282 may be formed between the process gas injection port 242 and the first cleaning gas injection port 272 in FIG. 7. However, embodiments of the inventive concepts are not limited thereto.

A method of forming a thin film using the furnace-type semiconductor apparatus 10, 10a or 10b and a method of cleaning the furnace-type semiconductor apparatus 10, 10a or 10b will be described hereinafter.

The method of forming the thin film using the furnace-type semiconductor apparatus 10, 10a or 10b will be first described hereinafter. In the present embodiment, the thin film may be, for example, a silicon oxide layer.

Wafers W (hereinafter, referred to as "substrates W") on which a predetermined semiconductor process was performed may be loaded in the boat 400. The boat 400 receiving a plurality of substrates W may be moved into the inner tube 202 of the process chamber 200. Thereafter, the opening and closing member 150 provided under the flange 220 may close the bottom end of the flange 220 to seal the inside (or the inner space) of the process chamber 200.

Next, the inner pressure of the process chamber 200 may be regulated to a desired process pressure using the vacuum exhaust unit 260. According to an embodiment of the inventive concepts, the process pressure may range from about 0.2 Torr to about 5 Torr. In addition, the inner temperature of the process chamber 200 may be regulated to a desired process temperature using the heating member 230. According to an embodiment of the inventive concepts, the process temperature may range from about 500 degrees Celsius to about 800 degrees Celsius.

The process gas supply unit 240 may inject the process gas into the process chamber 200 at the process pressure and the process temperature. For example, the process gas may include hexa-chlorodisilane (HCD) and nitrous oxide ($N_2O$). The process gas injected in the process chamber 200 may be pyrolyzed to be deposited on the substrates W. As a result, a silicon oxide layer may be formed on the substrates W. After the deposition process is performed, the purge gas may be injected into the process chamber 200 to purge reaction by-products and a residual gas which remain in the process chamber 200. In an embodiment, the purge operation may be performed at a temperature of 500 degrees Celsius to 800 degrees Celsius and a pressure of 3 Torr to 10 Torr. Thereafter, the boat 400 may be moved into the load-lock chamber 300, and the substrates W loaded in the boat 400 may be unloaded. Thus, the process of forming the thin film may be finished.

When the aforementioned process of forming the thin film is performed, reaction products and/or reaction by-products generated during the process may also be deposited on (or adhered to) an inner surface of the process chamber 200 (e.g., the inner and outer sidewalls of the inner tube 202, the inner sidewall of the outer tube 204, and the inner sidewall of the flange 220), thereby forming an adhered material. When the process of forming the thin film is repeatedly performed a plurality of times, the amount of adhered material formed on the inner surface of the process chamber 200 may be increased and may be detached from the inner surface of the process chamber 200 to generate particles. Thus, a cleaning process for removing the adhered material adhered to the inner surface of the process chamber 200 may be performed after the process of forming the thin film is repeatedly performed a predetermined number of times.

Figure 8:
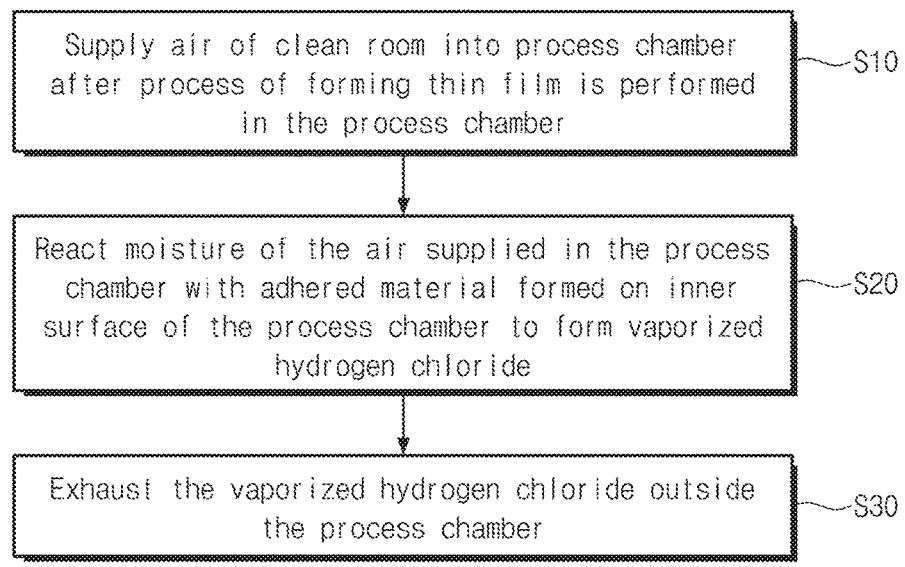
FIG. 8 is a flow chart illustrating a method of cleaning a furnace-type semiconductor apparatus according to an embodiment of the inventive concepts.
Figure 9A:
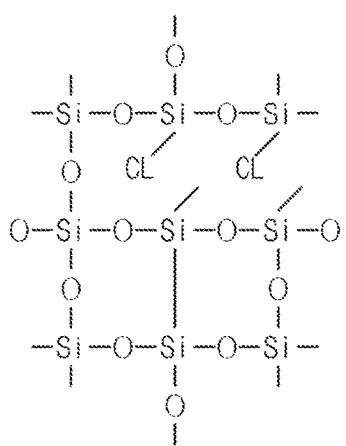
FIGS. 9A and 9B are views illustrating chemical bond states of an adhered material before and after cleaning a furnace-type semiconductor apparatus.
Figure 9B:
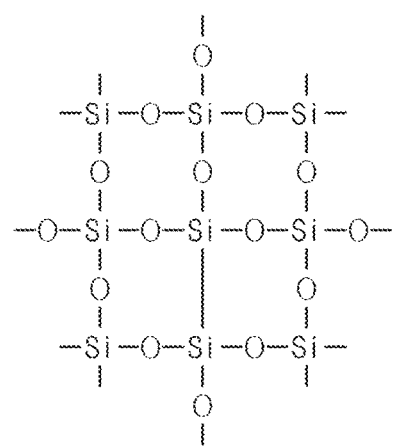

The method of cleaning the furnace-type semiconductor apparatus 10, 10a or 10b will be described hereinafter. FIG. 8 is a flow chart illustrating a method of cleaning the furnace-type semiconductor apparatus 10, 10a or 10b according to embodiments of the inventive concepts. FIGS. 9A and 9B are views illustrating chemical bond states of an adhered material before and after cleaning the furnace-type semiconductor apparatus 10, 10a or 10b. In example embodiments of the inventive concepts, since the silicon precursor containing chlorine is used as a silicon source for forming the silicon oxide layer, the adhered material adhered to the inner surface of the process chamber 200 may include a compound including silicon, oxygen, and chlorine. FIG. 9A illustrates the chemical bond state of the adhered material including this compound. Chlorine (Cl) bonded to silicon (Si) may reduce bonding strength of the adhered material. This may be a factor in increasing occurrence of the particles caused by the adhered material. The method of cleaning the furnace-type semiconductor apparatus 10, 10a or 10b according to embodiments of the inventive concepts may effectively remove chlorine included in the adhered material, and thus, the occurrence of the particles caused by the adhered material may be markedly reduced.

Referring to FIG. 8, the method of cleaning the furnace-type semiconductor apparatus 10, 10a or 10b may include supplying the air existing in the clean room 1 into the process chamber 200 after the process of forming the thin film (S10), reacting moisture ($H_2O$) of the air supplied in the process chamber 200 with the adhered material formed on the inner surface of the process chamber 200 to form vaporized hydrogen chloride (HCl) (S20), and exhausting the vaporized hydrogen chloride outside the process chamber 200 (S30).

In the furnace-type semiconductor apparatus 10 of FIGS. 1 and 2, as described above, since the boat 400 is moved vertically during the purge operation of the load-lock chamber 300 (i.e., the boat 400 is repeatedly moved between the process chamber 200 and the load-lock chamber 300 in the vertical direction during the purge operation of the load-lock chamber 300), the air of the clean room 1 may be supplied into the process chamber 200. On the other hand, in the furnace-type semiconductor apparatuses 10a and 10b of FIGS. 4, 5, 6 and 7, the air of the clean room 1 may be supplied into the process chamber 200 by the first cleaning gas supply pipe 270 as well as the above mentioned method (i.e., the vertical movement of the boat 400). According to the inventive concepts, a flow rate of the air supplied into the process chamber 200 may range from 5 liters/minute to 20 liters/minute (l/min).

When the air of the clean room 1 is supplied in the process chamber 200, the inside of the process chamber 200 may be thermally treated using the supplied air. In the furnace-type semiconductor apparatus 10 of FIGS. 1 and 2, the thermal treatment of the process chamber 200 may be performed at a temperature of 500 degrees Celsius to 600 degrees Celsius under a normal pressure atmosphere or normal atmospheric pressure. On the other hand, in the furnace-type semiconductor apparatuses 10a and 10b using the first cleaning gas supply unit 270, the thermal treatment of the process chamber 200 may be performed at a temperature of 500 degrees Celsius to 800 degrees Celsius and a pressure of 3 Torr to 10 Torr. During the thermal treatment of the process chamber 200, the moisture of the air supplied in the process chamber 200 may react with the adhered material formed on the inner surface of the process chamber 200 to form the vaporized hydrogen chloride. In other words, chlorine contained in the adhered material may react with the moisture ($H_2O$) to form hydrogen chloride, as expressed by the following chemical formula. The hydrogen chloride may be vaporized to be separated from the adhered material.

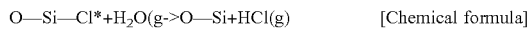
[Chemical formula]

FIG. 9B illustrates the chemical bond state of the adhered material after the cleaning process is performed. Generally, a cleaning process for reforming a surface of the adhered material formed on the inner surface of the process chamber 200 or for removing shedding particles in the process chamber 200 may be performed by a purge operation using an inert gas such as nitrogen. In this case, chemical reaction of chlorine contained in the adhered material may not progress, and thus, it may be difficult to remove the chlorine contained in the adhered material. This means that the bonding strength of the adhered material may be reduced to increase particles generated from the adhered material. However, according to embodiments of the inventive concepts, since the air existing in the clean room 1 is used as the cleaning gas, the chlorine of the adhered material formed on the inner surface of the process chamber 200 may be easily removed by the chemical reaction with the moisture of the air. As a result, the bonding strength of the adhered material may be reinforced to reduce the particles separated from the adhered material. In addition, the process of forming the thin film may be performed in the furnace-type semiconductor apparatus 10, 10a or 10b cleaned by the cleaning method described above, and thus, particle defects of the thin film may be reduced to improve a yield of semiconductor devices.

In an embodiment, the vaporized hydrogen chloride may be exhausted outside the process chamber 200 through the load-lock chamber 300 and the air circulation path 130 during the purge operation of the load-lock chamber 300. In an embodiment, the vaporized hydrogen chloride may be exhausted outside the process chamber 200 through the exhaust pipe 264 by pumping of the vacuum pump 268.

Meanwhile, in the furnace-type semiconductor apparatus 10b of FIGS. 6 and 7, the moisture of the air of the clean room 1 may be supplied into the process chamber 200 and additional moisture ($H_2O$) may also be supplied into the process chamber 200 using the second cleaning gas supply unit 280. In an embodiment, a gas containing hydrogen and oxygen may be supplied into the process chamber 200 by the second cleaning gas supply unit 280. The gas containing hydrogen and oxygen supplied in the process chamber 200 may form water vapor ($H_2O$), and the water vapor may react with chlorine of the adhered material to form vaporized hydrogen chloride. Alternatively, air containing moisture may be supplied into the process chamber 200 by the second cleaning gas supply unit 280, and thus, chlorine of the adhered material in the process chamber 200 may be removed.

In embodiments of the inventive concepts, the vertical furnace-type semiconductor apparatus is described as an example. However, embodiments of the inventive concepts are not limited thereto. Embodiments of the inventive concepts may be applied to a horizontal furnace-type semiconductor apparatus.

According to embodiments of the inventive concepts, since the air of the clean room is used as the cleaning gas, the chlorine of the adhered material formed on the inner surface of the process chamber may be easily removed by the chemical reaction with the moisture of the air of the clean room. As a result, the bonding strength of the adhered material may be reinforced to reduce or minimize particles generated from the adhered material. In addition, the process of forming a thin film may be performed in the furnace-type semiconductor apparatus cleaned by the cleaning method described above, and thus, particle defects of the thin film may be reduced or minimized to increase the yield of semiconductor devices.

While the inventive concepts have been described with reference to example embodiments, it will be apparent to those skilled in the art that various changes and modifications may be made without departing from the spirit and scope of the inventive concepts. Therefore, it should be understood that the above embodiments are not limiting, but illustrative. Thus, the scope of the inventive concepts are to be determined by the broadest permissible interpretation of the following claims and their equivalents, and shall not be restricted or limited by the foregoing description.

What is claimed is:

1. A method of cleaning a furnace-type semiconductor apparatus that is equipped in a clean room and includes a process chamber in which a process of forming a thin film is performed on a substrate, the method comprising:
   supplying air of the clean room into the process chamber after the process of forming the thin film; and
   thermally treating an inside of the process chamber using the air of the clean room supplied to the inside of the process chamber,
   wherein an adhered material containing chlorine is formed on an inner surface of the process chamber by the process of forming the thin film,
   wherein the chlorine of the adhered material is removed by the thermally treating the inside of the process chamber,
   wherein the supplying the air of the clean room comprises using a first cleaning gas supply pipe connected to the process chamber,
   wherein one end of the first cleaning gas supply pipe is connected to the process chamber and another end of the first cleaning gas supply pipe is located in the clean room, and
   wherein the furnace-type semiconductor apparatus further comprises:

a load-lock chamber disposed under the process chamber, the load-lock chamber configured to purge an inside of the load-lock chamber by drawing in the air of the clean room; and a boat holding the substrate during the process of forming the thin film, the boat configured to be moved vertically between the process chamber and the load-lock chamber, wherein the supplying of the air of the clean room comprises:

purging the inside of the load-lock chamber by drawing in the air of the clean room; and vertically moving the boat between the process chamber and the load-lock chamber during the purging of the inside of the load-lock chamber to provide the air of the clean room drawn in the load-lock chamber into the process chamber.

2. The method of claim 1, wherein the air of the clean room includes moisture ($H_2O$), and wherein the chlorine is converted into vaporized hydrogen chloride by reaction with the moisture so as to be separated from the adhered material.

3. The method of claim 2, further comprising:

exhausting the vaporized hydrogen chloride outside the process chamber.

4. The method of claim 1, wherein the using the first cleaning gas supply pipe comprises drawing in the air of the clean room using an air-intake device on the first cleaning gas supply pipe.

5. The method of claim 1, further comprising:

supplying a gas containing hydrogen and oxygen into the process chamber using a second cleaning gas supply unit connected to the process chamber.

6. The method of claim 5, wherein the gas containing hydrogen and oxygen is supplied into the process chamber to form water vapor, and wherein the chlorine is converted into vaporized hydrogen chloride by reaction with the water vapor so as to be separated from the adhered material.

7. The method of claim 5, wherein the second cleaning gas supply unit comprises: a cleaning gas tank storing the gas containing hydrogen and oxygen; and a second cleaning gas supply pipe connecting the cleaning gas tank to the process chamber.

8. The method of claim 1, further comprising:

supplying air containing moisture into the process chamber using a second cleaning gas supply unit connected to the process chamber.

9. The method of claim 1, wherein the thermally treating the inside of the process chamber is performed at a temperature of 500 degrees Celsius to 800 degrees Celsius and a pressure of 3 Torr to 10 Torr.

10. The method of claim 1, wherein the furnace-type semiconductor apparatus further comprises: an opening and closing member disposed between the process chamber and the load-lock chamber, wherein the opening and closing member is configured to open and close a path through which the boat is moved vertically, and wherein the opening and closing member opens the path during the purging of the inside of the load-lock chamber.

11. The method of claim 10, wherein the thermally treating the inside of the process chamber is performed at a temperature of 500 degrees Celsius to 600 degrees Celsius under normal atmospheric pressure.

12. The method of claim 1, wherein the adhered material includes silicon oxide containing chlorine.

13. The method of claim 1, wherein the process of forming the thin film is performed using a silicon precursor containing chlorine and a gas containing oxygen, and wherein the silicon precursor containing chlorine includes di-chlorosilane (DCS) or hexa-chlorodisilane (HCD).

14. The method of claim 1, wherein a flow rate of the air of the clean room supplied into the process chamber ranges from 5 liters/minute to 20 liters/minute.

15. A method of cleaning a furnace-type semiconductor apparatus that is equipped in a clean room and includes a process chamber in which a process of forming a thin film is performed on a substrate, the method comprising:

supplying air from the clean room into the process chamber after the process of forming the thin film; and using the air supplied from the clean room, removing chlorine from an adhered material formed on an inner surface of the process chamber due to the process of forming the thin film, wherein the furnace-type semiconductor apparatus further comprises:

a load-lock chamber disposed under the process chamber, the load-lock chamber configured to purge an inside of the load-lock chamber by drawing in the air of the clean room; and a boat configured to hold the substrate and configured to move vertically between the process chamber and the load-lock chamber, wherein the supplying the air of the clean room comprises:

purging the inside of the load-lock chamber by drawing in the air of the clean room; and vertically moving the boat between the process chamber and the load-lock chamber during the purging the inside of the load-lock chamber to provide the air of the clean room drawn in the load-lock chamber into the process chamber.

16. The method of claim 15, wherein the supplying the air of the clean room comprises using a first cleaning gas supply pipe comprising a first end connected to the process chamber and a second, opposite end that is in the clean room.

17. The method of claim 15, further comprising supplying air containing moisture into the process chamber using a cleaning gas supply unit connected to the process chamber.

18. A method of cleaning a furnace-type semiconductor apparatus that is equipped in a clean room and includes a process chamber in which a process of forming a thin film is performed on a substrate, the method comprising:

supplying air of the clean room including moisture ($H_2O$) into the process chamber after the process of forming the thin film;

converting chlorine of an adhered material formed on an inner surface of the process chamber due to the process of forming the thin film into vaporized hydrogen chloride by reaction with the moisture to separate the chlorine from the adhered material; and exhausting the vaporized hydrogen chloride outside the process chamber, wherein the furnace-type semiconductor apparatus further comprises a load-lock chamber disposed under the process chamber and a boat configured to hold the substrate and configured to move vertically between the process chamber and the load-lock chamber, wherein the supplying the air of the clean room is carried out in response to vertically moving the boat between the process chamber and the load-lock chamber.

19. The method of claim 18, wherein the supplying the air of the clean room is further carried out using a first cleaning gas supply pipe comprising a first end connected to the process chamber and a second, opposite end that is in the clean room.

* * * * *